United States Patent
Blanchard

[19]
[11] Patent Number: 6,069,385
[45] Date of Patent: *May 30, 2000

[54] TRENCH MOS-GATED DEVICE

[75] Inventor: Richard A. Blanchard, Los Altos, Calif.

[73] Assignee: STMicroelectronics, Inc., Carrollton, Tex.

[*] Notice: This patent is subject to a terminal disclaimer.

[21] Appl. No.: 09/057,913

[22] Filed: Apr. 9, 1998

Related U.S. Application Data

[63] Continuation of application No. 08/689,904, Aug. 15, 1996, Pat. No. 5,756,386, which is a continuation of application No. 08/474,711, Jun. 7, 1995, Pat. No. 5,648,670.

[51] Int. Cl.[7] .................................................... H01L 29/76
[52] U.S. Cl. ......................... 257/332; 257/327; 257/330
[58] Field of Search .................................... 257/327, 330, 257/332

[56] References Cited

U.S. PATENT DOCUMENTS

| | | | |
|---|---|---|---|
| 4,344,081 | 8/1982 | Pao et al. | 257/378 |
| 4,345,265 | 8/1982 | Blanchard | 257/339 |
| 4,393,391 | 7/1983 | Blanchard | 257/343 |
| 4,402,003 | 8/1983 | Blanchard | 257/337 |
| 4,791,462 | 12/1988 | Blanchard | 257/260 |
| 4,893,160 | 1/1990 | Blanchard | 257/334 |
| 4,896,196 | 1/1990 | Blanchard | 257/139 |
| 4,914,058 | 4/1990 | Blanchard | 238/270 |
| 4,929,991 | 5/1990 | Blanchard | 257/339 |
| 4,952,992 | 8/1990 | Blanchard | 257/342 |
| 4,956,700 | 9/1990 | Blanchard | 257/342 |
| 4,967,245 | 10/1990 | Cogan et al. | 257/331 |
| 4,983,535 | 1/1991 | Blanchard | 438/270 |
| 4,992,390 | 2/1991 | Chang | 438/270 |
| 5,034,785 | 7/1991 | Blanchard | 257/330 |
| 5,341,011 | 8/1994 | Hshieh et al. | 257/330 |
| 5,352,915 | 10/1994 | Hutchings et al. | 257/329 |
| 5,442,214 | 8/1995 | Yang | 257/328 |
| 5,648,670 | 7/1997 | Blanchard | 257/329 |
| 5,895,952 | 4/1999 | Darwish et al. | 257/330 |

FOREIGN PATENT DOCUMENTS

| | | |
|---|---|---|
| 03011765 | 1/1991 | Japan . |
| 2014787 | 8/1979 | United Kingdom . |

OTHER PUBLICATIONS

Matsumoto et al., "A High-Performance Self-Aligned UMOSFET with a vertical trench contact structure." IEEE (May 1994).

Chang et al., "Self-Aligned UMOSFET's with a Specific On-Resistance of 1M $\Omega.cm^2$" IEEE (Nov. 1987).

Hu, "A Parametric Study of Power Mosfets" IEEE (Mar. 1979).

*Primary Examiner*—Mahshid Saadat
*Assistant Examiner*—George C. Eckert, II
*Attorney, Agent, or Firm*—Theodore E. Galanthay; Lisa K. Jorgenson; Peter J. Thoma

[57] ABSTRACT

A low-voltage high-current discrete insulated-gate field-effect transistor which is made by a very economical process with two silicon etches. A buried poly gate gates conduction along a trench sidewall. The channel is provided by the residuum of an epi layer, and the source diffusion is provided by an unmasked implant which is screened only by various grown oxides.

2 Claims, 8 Drawing Sheets

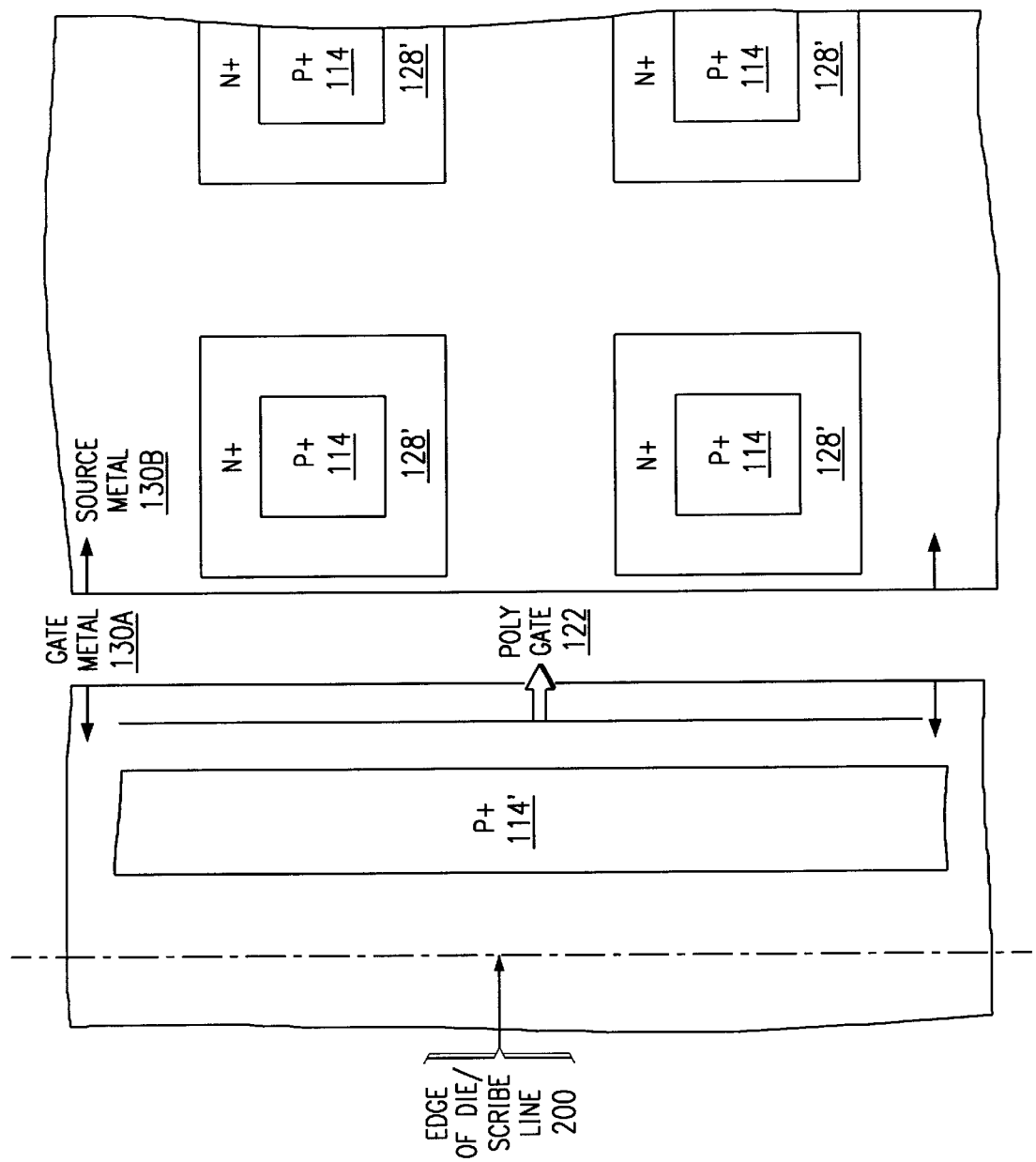

TRENCH MOS-GATED DEVICE

CROSS-REFERENCE TO RELATED APPLICATIONS

This application is a continuation of Ser. No. 08/689,904 filed Aug. 15, 1996 which issued on May 26, 1998 as U.S. Pat. No. 5,756,386; which is a continuation of application Ser. No. 08/474,711 filed Jun. 7, 1995 which issued on Jul. 15, 1997 as U.S. Pat. No. 5,648,670.

BACKGROUND AND SUMMARY OF THE INVENTION

The present invention relates to power transistors, and particularly to high-current discrete insulated-gate field-effect transistors which operate at only modest voltages.

Insulated-gate field-effect transistors are increasingly common in power devices. One outstanding advantage of such transistors is that they are voltage-controlled devices, which permits control circuits and algorithms to be simpler.

Different applications require different combinations of transistor parameters. Various applications may require:
high stand-off voltage;
low on-resistance;
fast switching (at turn-on, turn-off, or both);
tolerance of heavily inductive loads;
pull-up, pull-down, or bidirectional operation;
good thermal stability; and/or
graceful recover from breakdown.

Various device configurations have accordingly been used to satisfy the needs of various applications. One class of devices is trench transistors, which have been proposed for high-current density devices which operate at relatively low voltages (e.g. 30 to 100V max). A number of patents and publications have described trench transistors and methods for fabricating them; see e.g. U.S. Pat. Nos. 4,393,391, 4,344,081, 4,345,265, 4,402,003, 4,791,462, 4,893,160, 4,896,196, 4,914,058, 4,929,991, 4,952,992, 4,956,700, 4,983,535, and 5,034,785, all of which are hereby incorporated by reference. (Power FETs are more generally discussed in the following texts, all of which are hereby incorporated by reference: B. E. Taylor, POWER MOSFET DESIGN (1993); B. J. Baliga, MODERN POWER DEVICES (1987); Grant and Gowar, POWER MOSFETS: THEORY AND APPLICATIONS (1989); and E. Oxner, POWER FETS AND THEIR APPLICATIONS (1982).)

The present application provides a new process and structure for fabricating power trench transistors. According to a first class of innovative process embodiments, a trench transistor is made by a very economical process with two silicon etches. In a second (and more preferred) process embodiment, only one silicon etch is required, and one local oxidation step is omitted.

The first embodiment begins with a P-on-N-on-N+ epitaxial or implanted structure. After formation of a patterned thick oxide, a nitride layer (with an oxide pad under it) is patterned to define deep-body locations. A first silicon etch provides some undercut under the nitride, and the nitride then also provides an implant mask for a P+ body implant. Oxidation and removal of the nitride then permit two subsequent steps to be performed in a self-aligned fashion: first, the trench etch can now be masked by the pattern of the grown oxide. After a gate oxide is grown in the trench, and poly is deposited and patterned, the source implant too can be performed as a self-aligned step. This provides an extremely economical process, which can use as few as six masking steps total.

In one alternative modification to this first class of embodiments, an additional mask is used for the trench etch. This adds cost, but reduces the variability of channel length.

In another alternative modification to this first class of embodiments, the step of patterning the thick oxide can be omitted.

In a second class of embodiments, a single resist patterning step is used to pattern a LOCOS stack and to perform the trench etch. The source and channel diffusions are formed before the trench etch, and are unpatterned (so this is not a DMOS process). After the trench etch a gate oxide is formed on the trench sidewalls, and polysilicon is then conformally deposited and etched. The duration of the polysilicon etch is not long enough to clear it from the trenches, so (in addition to the patterned polysilicon lines at the surface) a buried insulated mesh of polysilicon runs wherever the trenches run. An oxidation step forms thick oxide over the poly, and the LOCOS stack is then stripped to expose the N+ source diffusion. A patterned silicon etch and implant now form the deep body diffusions, and metal is then deposited and patterned.

Either of these embodiments provides an extremely planar power device structure which can be fabricated by a very simple process sequence.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 4 shows a plan view of a sample transistor structure according to this embodiment.

DETAILED DESCRIPTION OF THE PREFERRED EMBODIMENTS

Figure 1A:
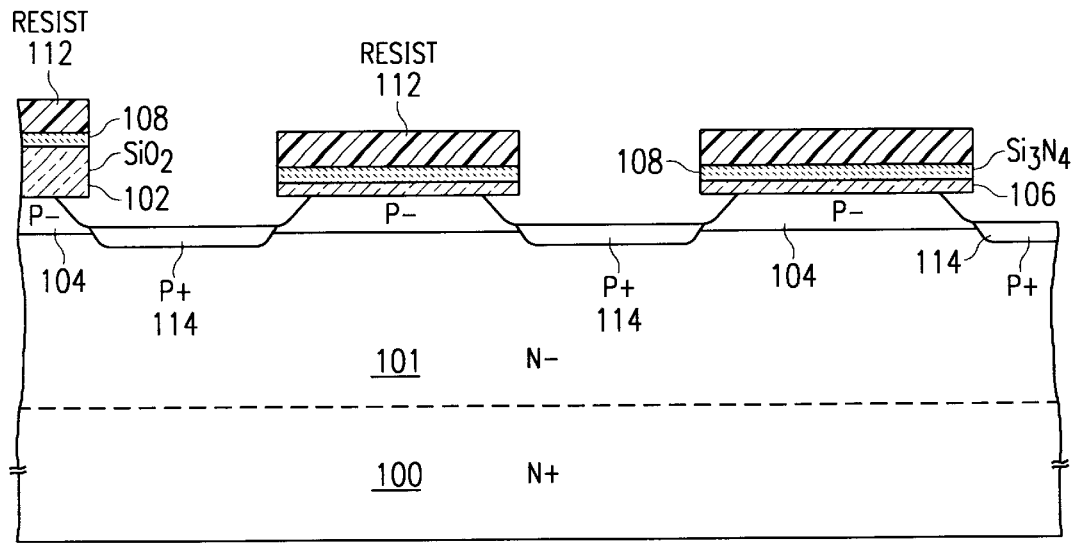
FIGS. 1A–1I show process steps in a sample innovative embodiment.

The numerous innovative teachings of the present application will be described with particular reference to the presently preferred embodiment (by way of example, and not of limitation), in which:

FIGS. 1A–1I show a process steps in a sample innovative embodiment. In these Figures, the left side of the drawing shows structures used in the termination region, and the right side shows a cell in the array. (In the complete device, an array of many trench devices is used to provide a large current-carrying capacity.)

This sample embodiment starts with an N-on-N+ epitaxial structure, having an N–epitaxial layer 101, doped to e.g. 0.2–5 $\Omega$-cm, and having a thickness in the range of e.g. 2–10$\mu$, on an N+ substrate 100.

A thick field oxide 102 is grown overall (e.g. to 2000–14000 Å), patterned, and etched. (Alternatively, the field oxide may be formed by a LOCOS process, or may even be deposited.)

A p-type implant is then performed, e.g. with a dose in the range of 1E13–5E14 cm$^{-2}$ (i.e. $10^{13}$ to $51\times10^{14}$), and with an energy selected to produce a junction depth $x_j$ in the range of e.g. 0.6–2.5 $\mu$m (after the high-temperature steps are completed). (Alternatively, the p- implant may be performed before the field oxidation process, but this may provide worse breakdown characteristics at the periphery.) This implant forms the shallow p- surface region 104 in FIG. 1A, which will later be used to form the transistor channel regions.

A pad oxide 106 is then grown on silicon, e.g. to 500 Å thickness, and a silicon nitride layer 108 is then formed, e.g. by CVD to 500 Å.

A photoresist layer 112 is then applied and patterned, and nitride 108, pad oxide 106, and silicon are etched accordingly. The silicon etch is preferably fairly isotropic, to give a substantial undercut under the oxide/nitride islands. This can be done e.g. with a wet etch in a hydrofluoric/nitric/acetic acid mixture, or with a gas etch under low vacuum or near-atmospheric pressures, e.g. a plasma-assisted chloro-etch. This produces silicon mesas under the remaining oxide/nitride islands.

A second p-type implant is then performed, e.g. with a dose in the range of 1E14–1E16 $cm^{-2}$, and with a relatively moderate energy selected to produce an eventual junction depth $x_j$ (after all high-temperature steps) in the range of e.g. 0.8–3.0 $\mu$m. This implant produces the deeper p-type regions 114.

The foregoing steps have produced the intermediate structure shown in FIG. 1A.

The remaining resist is now removed, and an oxidation step is then performed, to grow e.g. 1000–6000 Å of silicon dioxide 116 over the p-type regions 114.

Figure 1B:
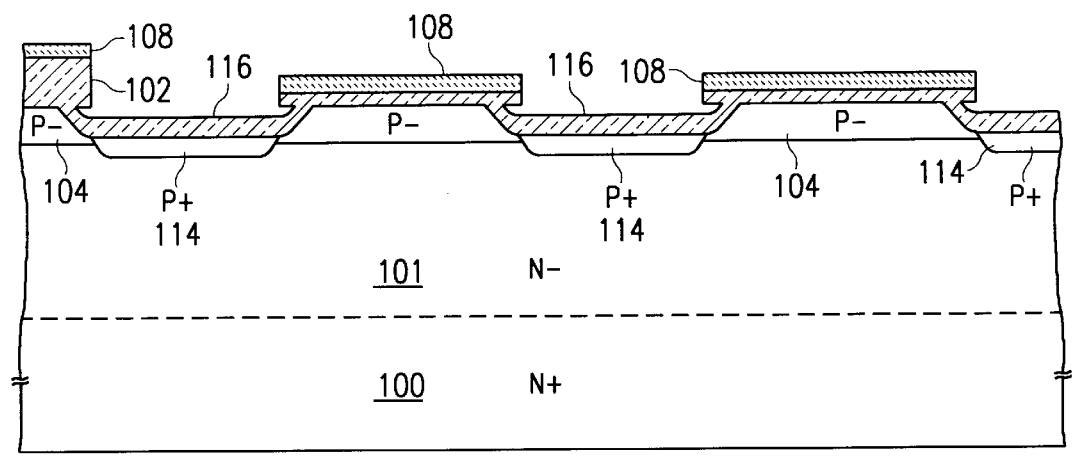

The foregoing steps have produced the intermediate structure shown in FIG. 1B.

The nitride 108 and pad oxide 106 are now stripped, e.g. by use of phosphoric acid followed by a very brief dip (e.g. 10 seconds) in weak buffered HF solution.

A trench etch is now performed, to cut through the tops of the mesas and form trenches 118 in silicon, e.g. to a depth of 1–6 $\mu$m. (The trench depth is selected in accordance with the desired operating voltage; at lower operating voltages lower trench depths can be used to minimize on-resistance.)

The trench etch can be performed with any one of a variety of chlorine-based plasma trench-etching recipes. Some examples of recipes for trench etching may be found in the following articles, all of which are hereby incorporated by reference: Oehrlein, "Applications of RF plasmas to etching processes in advanced semiconductor technology," in *Applications of Radio-Frequency Power Plasmas—Seventh Topical Conference,* 159 AIP CONFERENCE PROC. 442 (1987); Chieh et al., "Chemically assisted ion beam etching for silicon-based microfabrication," 141 J. ELECTROCHEM. SOC. 1585 (1994); Yunkin et al., "Highly anisotropic selective reactive ion etching of deep trenches in silicon," 23 MICROELECTRONIC ENGINEERING 373 (1994); Amirov et al., "Trench etching in silicon in a halogen-containing plasma with increased pressure," 22 RUSSIAN MICROELECTRONICS 197 (1993); Frank and Chabert, "Dry etching of single-crystal silicon trench in hydrogen iodide containing plasmas I," 140 J. ELECTROCHEM. Soc. 490 (1993); Zhang et al., "Reactive ion etching of SiGe alloys using $CF_2/Cl_2$," 71 J. APPLIED PHYSICS 1936 (1992); Wohl et al., "Trench etching using a $CBrF_3$ plasma and its study by optical emission spectroscopy," 42 VACUUM 905 (1991); Syau et al., "Reactive ion etching of silicon trenches using $SF_6/O_2$ gas mixtures," 138 J. ELECTROCHEM. Soc. 3076 (1991); Engelhardt, "MCR: an ECR alternative," 14 SEMICONDUCTOR INTERNATIONAL no.8, pp.52, 54–5 (July 1991); Lee and Zhou, "Feature-size dependence of etch rate in reactive ion etching," 138 J. ELECTROCHEM. Soc. 2439 (1991); Cooper et al., "Magnetically enhanced RIE etching of submicron silicon trenches," 1392 PROC. SPIE 253 (1991); Engelhardt, "Single crystal silicon trench etching for fabrication of highly integrated circuits," 1392 PROC. SPIE 210 (1991); Robb et al., "Deep trench isolation for high voltage applications," in PROC. SIXTH INTERNATIONAL SYMPOSIUM ON SILICON MATERIALS SCIENCE AND TECHNOLOGY: SEMICONDUCTOR SILICON 1990 at 801; Francou et al., "Trench process with HBr chemistry in RIPE," 13 MICROELECTRONIC ENGINEERING 425 (March 1991); Gluck and Hoppner, "Etching of silicon trenches in $CF_4$ plasma using photoresist/aluminium masks," 25 CRYSTAL RESEARCH AND TECHNOLOGY 277 (1990); Kassam et al., "Characterization of $BCl_3$-$Cl_2$ silicon trench etching," 137 J. ELECTROCHEM. SOC. 1613 (1990); Bestwick and Oehrlein, "Reactive ion etching of silicon using bromine containing plasmas," 8 J. VACUUM SCIENCE & TECHNOLOGY A 1696 (1990); and Crazzolara and Gellrich, "Profile control possibilities for a trench etch process based on chlorine chemistry," 137 J. ELECTROCHEM. SOC. 708 (1990).

For simplicity, the drawing shows trenches 118 as having square lower corners. However, this is not realistic; to avoid geometry-dependent electric field enhancement it is preferable to round the trench corners. This can be done as a natural result of various trench etches, or can be done by forming and stripping a sacrificial oxide from the trench surfaces.

The trenches 118 can be closely spaced; e.g. for a minimum patterned linewidth of 0.8 $\mu$m the trenches can have a width of e.g. 0.8–1.6 $\mu$m and a pitch of e.g. 1.6–6.4 $\mu$m. This tight geometry provides advantages in current density.

In general, the spacing may be constrained, for a given operating voltage, by the requirement that the depletion regions from the body will spread to isolate the drain from the channel region at a voltage less than that at which the channel region reaches breakdown. This same requirement also implies a relation between the depth of the body regions and the depth of the trench: preferably the depth of the body regions is at least one-third that of the trenches.

Note that the trench etch is performed, in the presently preferred embodiment, without any further masking step. This provides a very economical process. However, in an alternative embodiment, a further masking step is used to ensure that the trench sidewalls fall within the flat part of the mesas, and not on the sloped sidewalls. This provides slightly better control of the channel length.

Figure 1C:
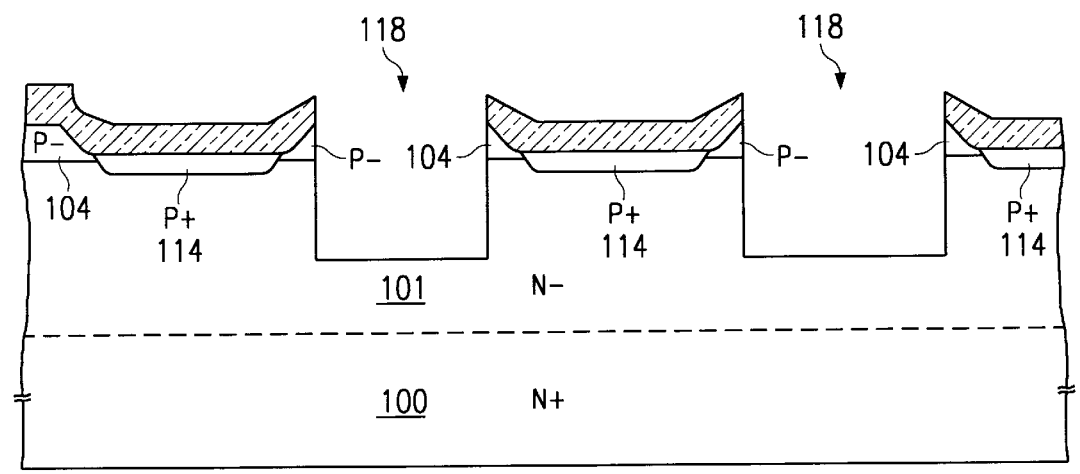

The foregoing steps have produced the intermediate structure shown in FIG. 1C.

A gate oxidation step is then performed, to grow gate oxide 120 e.g. to a thickness of 200–2000 Å, and polysilicon 122 is conformally. deposited (and eventually doped), e.g. to a thickness of 3000–6000 Å on flat surfaces (and preferably to a thickness which is sufficient to fill the trenches).

Figure 1D:
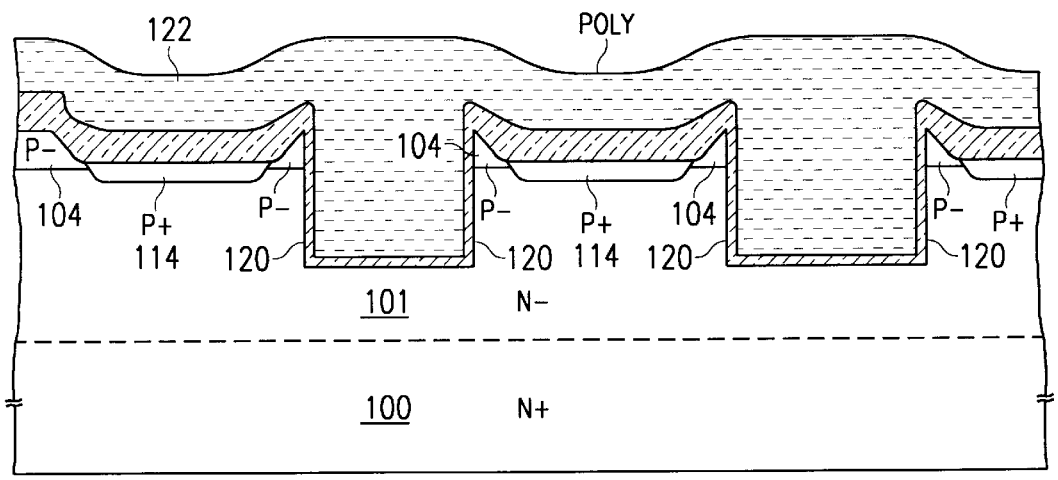

The foregoing steps have produced the intermediate structure shown in FIG. 1D.

The deposited polysilicon 122 is now patterned and etched. The polysilicon etch is preferably a timed plasma etch, which is continued for long enough to remove polysilicon from exposed flat surfaces, but not for long enough to remove any large depth of polysilicon from exposed trenches. Alternatively, endpoint detection may be used to detect the time when the polysilicon first starts to clear, and the etch may be continued for a fixed time thereafter.

Figure 1E:
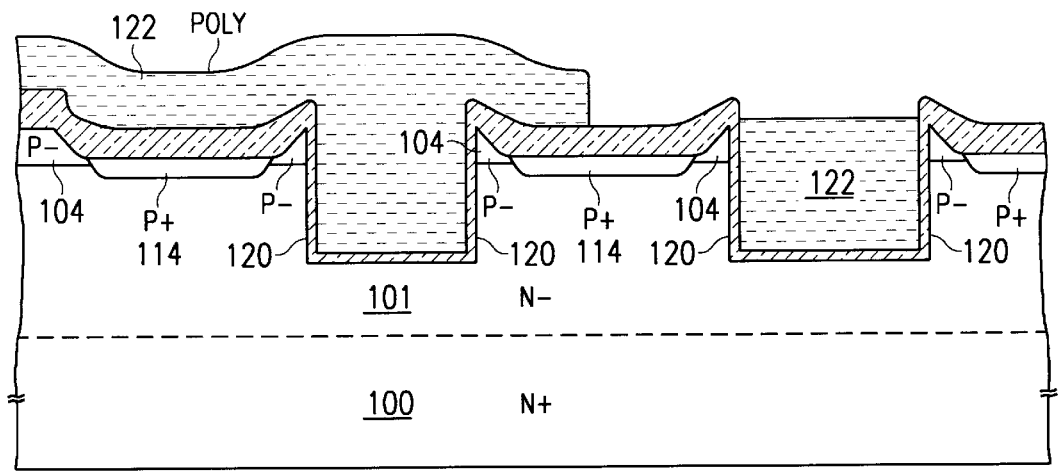

The foregoing steps have produced the intermediate structure shown in FIG. 1E.

A short steam oxidation step is now performed to grow additional oxide 124, to a thickness of e.g. 2000–5000 Å atop the polysilicon. (Of course oxide thickness in other areas will be increased at this time.)

Figure 1F:
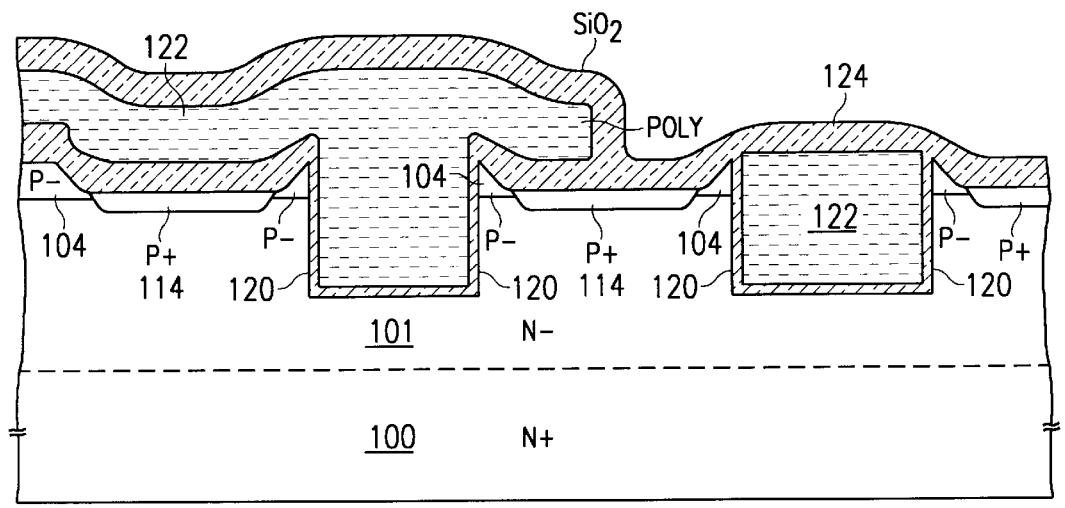

The foregoing steps have produced the intermediate structure shown in FIG. 1F.

A global oxide etchback is now performed, to a depth sufficient to uncover (or nearly uncover) the silicon corners next to the trenches, with e.g. 1500–3000 Å removed by plasma etching.

A further photoresist step is now used to expose and etch the oxide 124 over locations 126 where contact to polysilicon will be made.

A shallow heavy n-type implant is now performed to form source regions 128. In the presently preferred embodiment, this implant is performed with a dose of e.g. 5E14–1E16 $cm^{-2}$ of As at an energy of 20–150 keV.

There is an interaction between the depth of this implant and the depth of the polysilicon etch: to avoid excessive gate underlap, preferably the polysilicon in the trenches is not eroded more than 100 Å or so below the junction depth formed by the N+ implant.

Figure 1G:
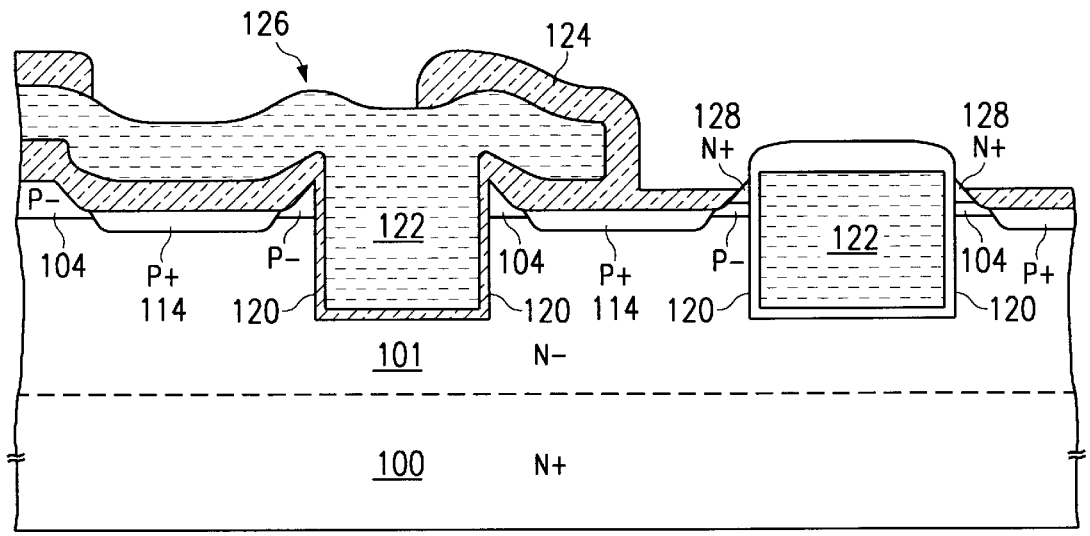

The foregoing steps have produced the intermediate structure shown in FIG. 1G.

A further global oxide etchback is now performed, to a depth sufficient to uncover the body regions 114, e.g. 1000–3000 Å is removed by plasma etching. This does not remove the thicker oxide on the polysilicon.

Figure 1H:
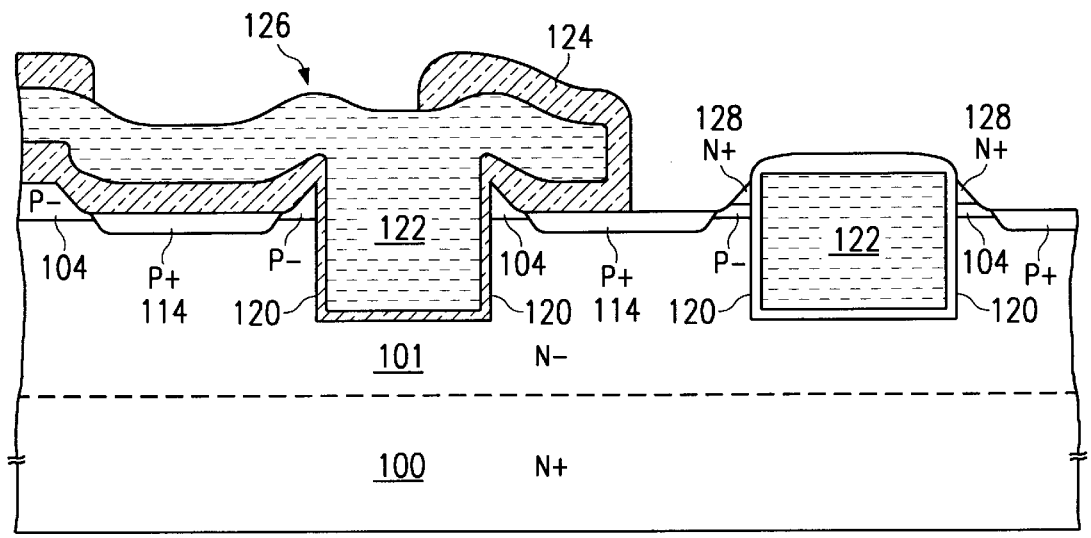

The foregoing steps have produced the intermediate structure shown in FIG. 1H.

A thin-film metallization 130 (e.g. $AlSi_{0.02}Cu_{0.04}$) is now deposited (e.g. to a thickness in the range of 0.8–3.0 $\mu$m), patterned, and etched. The metal provides source and body connections 130B in the area, and provides contacts to the polysilicon 130A with a spacing which is selected to minimize the RC time constant of the gate.

A passivation layer 132 is now deposited (e.g. 2000–4000 Å of compressive plasma silicon nitride, along or over 1000 Å of doped or undoped oxide).

The passivation layer is then patterned and etched to expose contact pad locations.

Figure 1I:
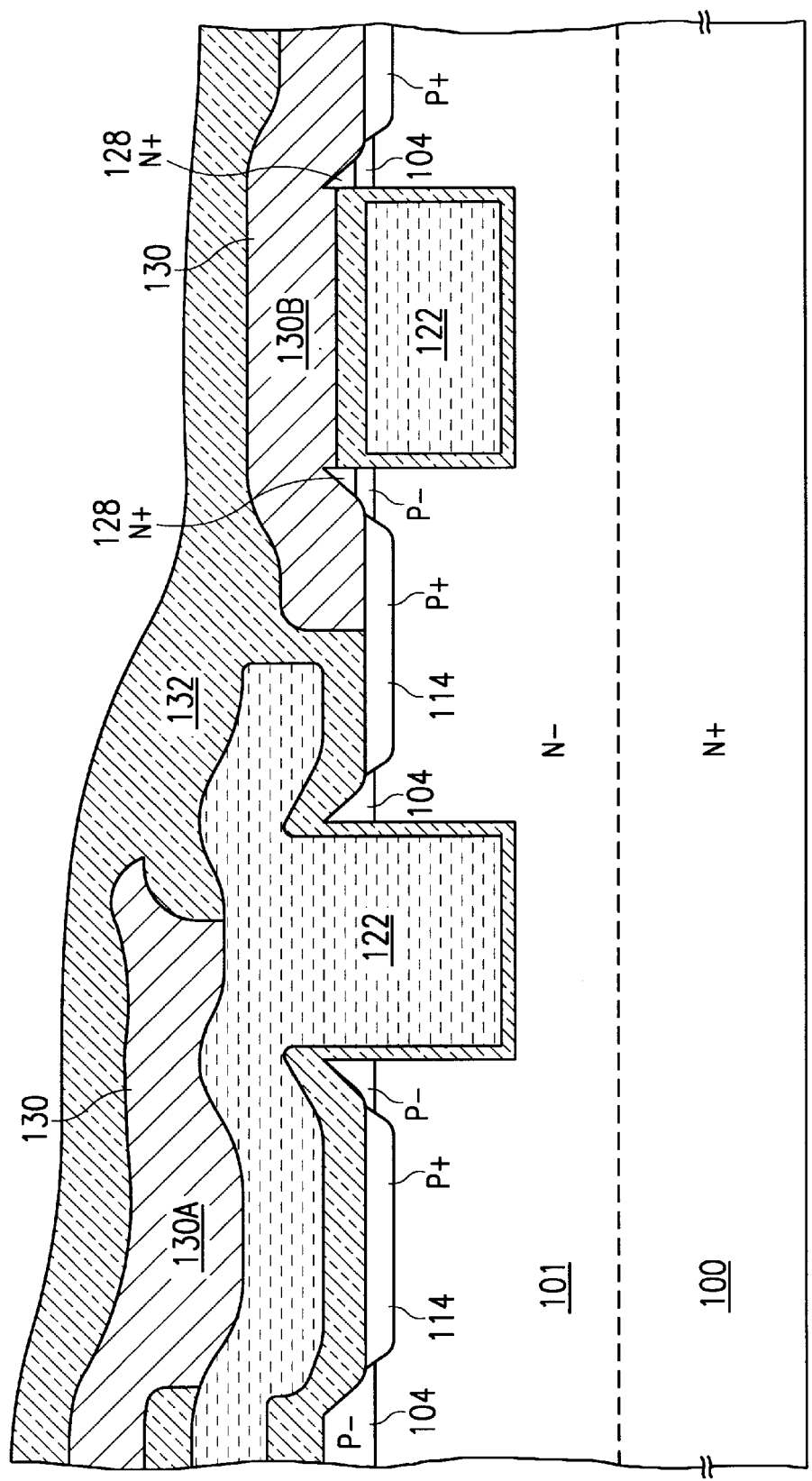

The foregoing steps have produced the finished structure shown in FIG. 1I.

For clarity, the foregoing process summary omits various minor steps, such as cleanups and anneals, which are very well known to those of ordinary skill in the art.

Figure 2:
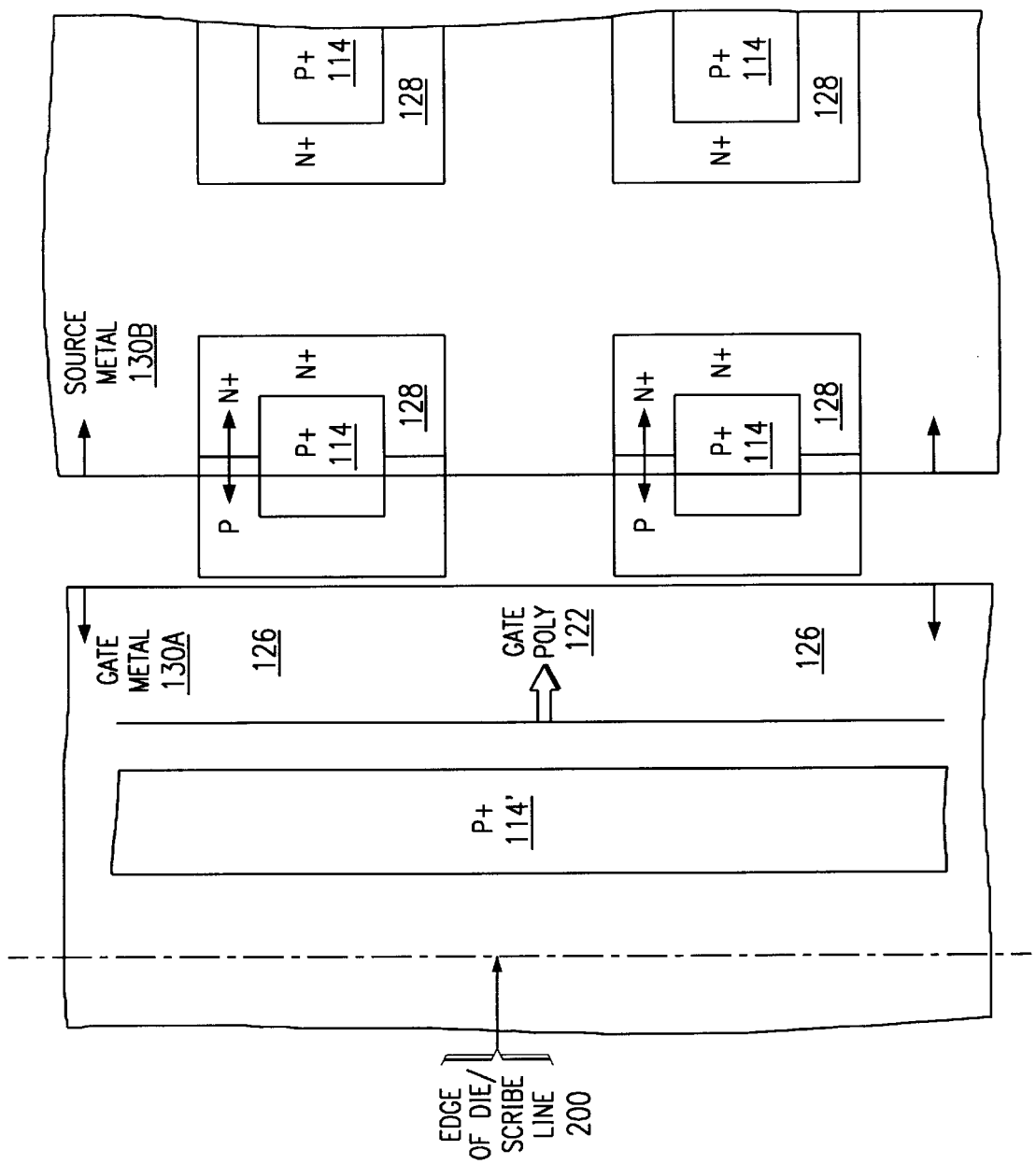
FIG. 2 shows a plan view of a sample transistor structure according to this embodiment.

FIG. 2 shows a plan view of a sample transistor structure according to the present invention. The illustrated example uses an array of square cells, but of course hexagonal cells, triangular cells, stripes, or other packing geometries can be used. Note that the trenches 118 and polysilicon gate lines 122 form a continuous mesh, and the source, body and channel diffusions are located on isolated islands. Note that a stripe of p+ diffusion 114' is used near the scribe line 200 for better array termination. Note also that gate metal 130A and polysilicon 122 overlap along a stripe contact 126.

FIGS. 3A–3E show process steps in a second and preferred innovative embodiment, and FIG. 4 shows a plan view of a sample transistor structure according to this embodiment.

The second class of embodiments produces a very similar final structure, but uses a different process to obtain it. The resulting junction depths and dopant concentrations are generally the same as in the preceding figures unless otherwise specified.

The starting material again includes an N-type epitaxial layer 101 (e.g. 0.8 Ω-cm) on an N+ substrate 100. However, in this case the p-type body diffusion 104' (e.g. implanted at 2E14 $cm^{-2}$ to a final junction depth of 1.5 $\mu$m) and the n+ source diffusion 128' (e.g. implanted at 2E15 $cm^{-2}$ to a final junction depth of 0.5 $\mu$m) are immediately formed as unpatterned diffusions.

Figure 3A:
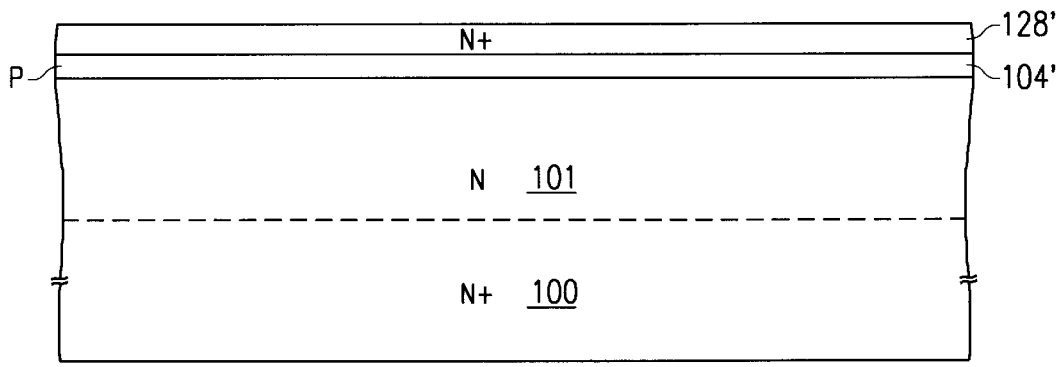
FIGS. 3A–3E show process steps in a second and preferred innovative embodiment.

These steps produce the intermediate structure of FIG. 3A.

The LOCOS stack (nitried 108, e.g. 800 Å thick, over grown pad oxide 106, e.g. 500 Å thick) is now formed as described above. A trench pattern now defines a stack etch which cuts through the LOCOS stack and into the silicon, to produce trenches 118 (e.g. 1.8 $\mu$m deep and 1.0 $\mu$m wide).

Figure 3B:
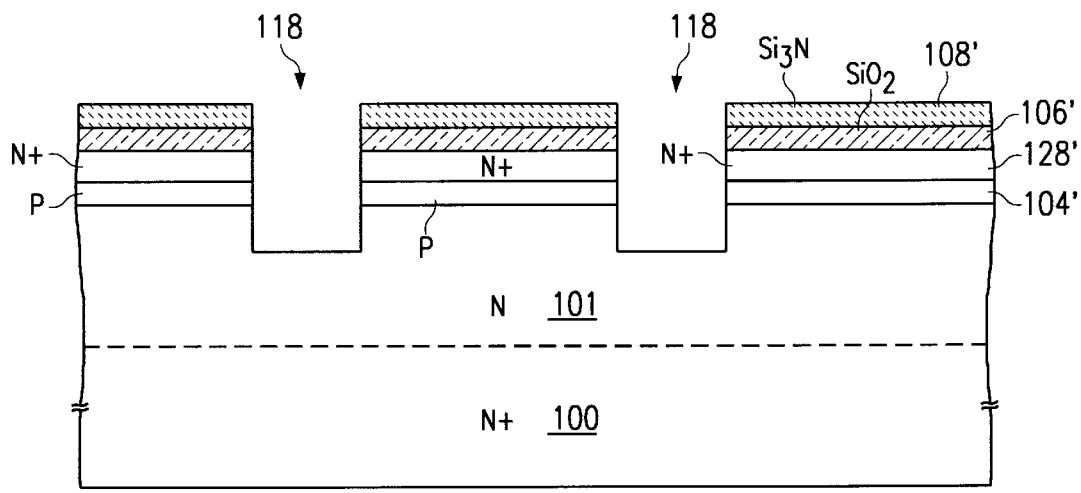

These steps produce the intermediate structure of FIG. 3B.

After the trench etch a gate oxide 120 is formed (e.g. to 1000 Å) on the trench sidewalls, and polysilicon 122 is then conformally deposited (e.g. to 6000 Å) and etched. The duration of the polysilicon etch is not long enough to clear it from the trenches, so (in addition to the patterned polysilicon lines 122' at the surface) a buried insulated mesh of polysilicon runs wherever the trenches run. An oxidation step forms thick oxide 124 (e.g. to 4000 Å thickness) over the polysilicon 122.

Figure 3C:
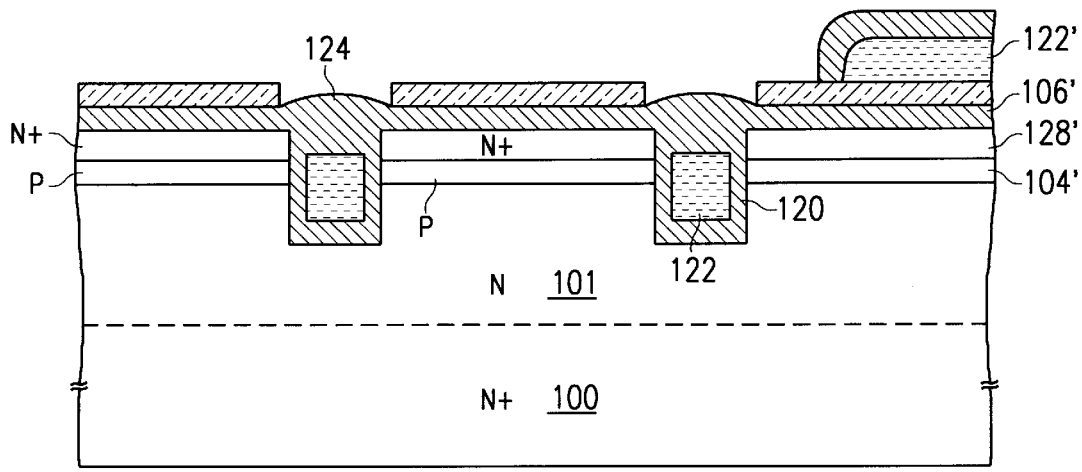

These steps produce the intermediate structure of FIG. 3C.

The next steps open polysilicon contacts 126, form deep body diffusions 114, and expose the source regions 128' for metallization. Optionally this can all be done by using a single patterning step: the resist is patterned to expose the desired locations of contacts 126 and deep body diffusions 114. A patterned nitride etch then removes the nitride 108 which is present over the deep body locations 114, and a short oxide etch then removes the pad oxide 106, but does not remove the much thicker oxide 124 which is present over the polysilicon contact locations 126. A silicon etch (e.g. to 0.8 $\mu$m depth) then cuts through the N+ layer 128', without eroding the oxide 124. A P+ implant is then performed; this is blocked by the remaining oxide 124 at poly contact locations 126, and by the photoresist everywhere else except at locations 114. An oxide etch then removes the remaining oxide 124 over contact locations 126. The resist is then stripped, and the LOCOS stack is then stripped by global nitride and oxide etches, exposing the source regions 128'. Alternatively, of course separate masks can be used for the deep body and poly contacts if desired.

Figure 3D:
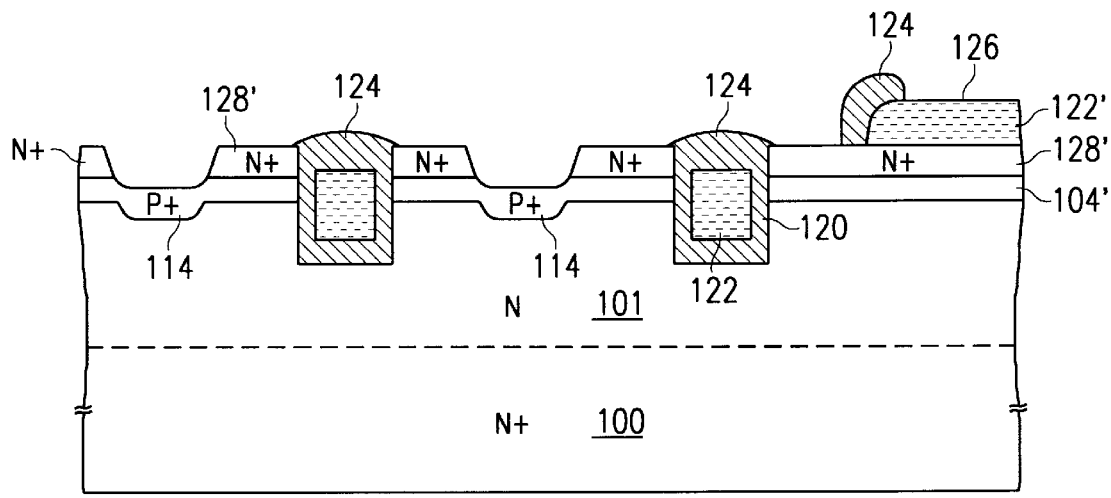

These steps produce the intermediate structure of FIG. 3D.

Metal 130 is then deposited (e.g. to a thickness of 2.0 $\mu$m) and patterned. Note that no interlevel dielectric is required, since the thick grown oxide 124 fills this function.

Figure 3E:
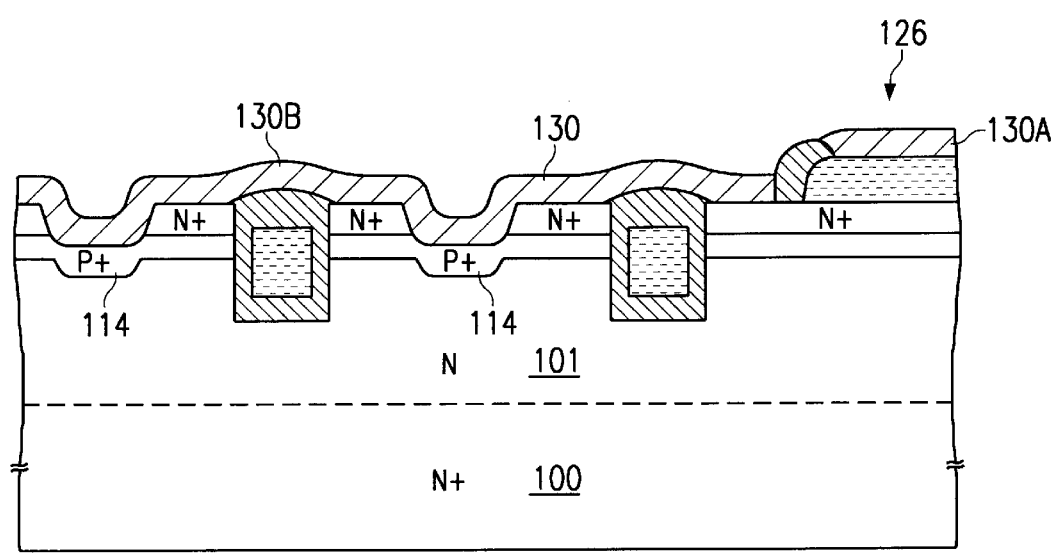

These steps produce the intermediate structure of FIG. 3E. Processing then concludes conventionally with protective overcoat deposition (e.g. 4000 Å of PSG covered by 4000 Å of plasma nitride), contact patterning, etc., as described above.

FIG. 4 shows a plan view of a sample transistor structure according to this embodiment. Note, however, that the termination struection is shown on the left in FIG. 4, but on the right in FIGS. 3A–3E. Note also that FIG. 4 uses a simpler termination structure than that shown in FIG. 2; otherwise the layouts are generally similar, and common reference numbers are used to indicated similarities.

According to a disclosed class of innovative embodiments, there is provided: A method for fabricating an array of insulated-gate field-effect transistors, comprising the steps of: providing substantially monocrystalline semiconductor material, including a first portion having a first conductivity type, a second portion which overlies said first portion and has a second conductivity type, and a third portion which overlies said second portion and has said first conductivity type; and forming oxidation-resistant material on said semiconductor material; etching both said oxidation-resistant material and said semiconductor material thereunder in a common pattern to form trenches in said semiconductor material; forming an insulating layer on sidewalls of said trenches; conformally depositing an oxidizable conductor overall, to a depth which fills said trenches, and etching back said oxidizable conductor to leave portions thereof in said trenches which are capacitively coupled to sidewall portions of said trenches; oxidizing said oxidizable conductor to form a thick insulating layer thereon; removing said oxidation-resistant material and substantially all of said third portion of semiconductor material from desired deep body locations, and introducing an additional concentration of dopants of said second conductivity type; and making contact to exposed portions of said third and second portions; whreby said third and second portions provide source and channel regions, respectively, of a field-effect transistor which is gated by said oxidizable conductor material within said trench.

According to another disclosed class of innovative embodiments, there is provided: A method for fabricating an array of insulated-gate field-effect transistors, comprising the steps of: providing substantially monocrystalline semiconductor material, including a substrate portion having a first conductivity type and an overlying portion having a second conductivity type; forming islands of oxidation-resistant material on said semiconductor material; etching said semiconductor material, where exposed by said islands, to remove said overlying portion thereof while also partially undercutting said islands to create mesas in said semiconductor material; implanting said semiconductor material where exposed by said islands, to create body regions of said second conductivity type in said substrate portion; removing said islands of oxidation-resistant material, and etching trenches into said semiconductor material in locations of said mesas; forming insulated gates which are capacitively coupled to sidewall portions of said trenches; forming source diffusions of a first conductivity type in remaining portions of said overlying portion adjacent to at least some ones of said trenches; and making contact to said source diffusions and body regions.

According to another disclosed class of innovative embodiments, there is provided: A method for fabricating an array of insulated-gate field-effect transistors, comprising the steps of: providing substantially monocrystalline semiconductor material, including a substrate portion having a first conductivity type and an overlying portion having a second conductivity type; forming trenches in said semiconductor material, extending through said overlying portion thereof into said substrate portion; forming a thin film layer of an oxidizable conductor which extends into said trenches to provide capacitive coupling to sidewall portions of said trenches; oxidizing said oxidizable conductor to form a thick oxide thereon; removing oxide overall, to a depth which is not sufficient to remove all oxide from said oxidizable conductor; implanting dopants of a first conductivity type to form source diffusions in remaining portions of said overlying portion adjacent to at least some ones of said trenches; and making contact to said source diffusions and body regions.

According to another disclosed class of innovative embodiments, there is provided: A method for fabricating an array of insulated-gate field-effect transistors, comprising the steps of: providing substantially monocrystalline semiconductor material, including a substrate portion having a first conductivity type and an overlying portion having a second conductivity type; forming islands of oxidation-resistant material on said semiconductor material; etching said semiconductor material, where exposed by said islands, to remove said overlying portion thereof while also partially undercutting said islands to create mesas in said semiconductor material; implanting said semiconductor material where exposed by said islands, to create body regions of said second conductivity type in said substrate portion; removing said islands of oxidation-resistant material, and etching trenches into said semiconductor material in locations of said mesas; forming insulated conductive gates which are capacitively coupled to sidewall portions of said trenches; forming a thin film layer of an oxidizable conductor which extends into said trenches to provide capacitive coupling to sidewall portions of said trenches; oxidizing said oxidizable conductor to form a thick oxide thereon; removing oxide overall, to a depth which is not sufficient to remove all oxide from said oxidizable conductor; implanting dopants of a first conductivity type to form source diffusions in remaining portions of said overlying portion adjacent to at least some ones of said trenches; and making contact to said source diffusions and body regions.

According to another disclosed class of innovative embodiments, there is provided: An integrated circuit, comprising: a network of trenches extending into monocrystalline semiconductor material from a first surface thereof; a first-conductivity-type source diffusion in said semiconductor material at some locations of said first surface thereof adjacent to said trenches, and a second-conductivity-type channel diffusion in said semiconductor material below said source diffusion; and an insulated conductive gate mesh inlaid into said network of trenches, and capacitively coupled to control conduction through said channel diffusions along sidewalls of said trenches; said first surface of said semiconductor material being depressed at locations away from said trenches.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, a P-channel device can easily be fabricated by reversing the doping type of every region of the device.

For another example, the buried polysilicon mesh which forms the gate does not have to be pure doped polysilicon. This can be formed, for example, by a multilayer deposition sequence, in which a small amount of polysilicon is conformally deposited, metal (e.g. tungsten) is conformally deposited and etched to clear (leaving metal on the trench sidewalls), and polysilicon is then conformally deposited to produce the intermediate structure of FIG. 1D.

For another example, the disclosed structure can also (alternatively and less preferably) be modified in various ways to produce a hybrid field-effect/bipolar device with reduced on-resistance. (However, many such structures entail an additional diode drop, and hence are not useful at the relatively low voltages where trench devices are most preferred.)

For another example, the disclosed structure can be combined with an additional p-type buried layer (and preferably an additional n-type buried layer above that) to form a switched emitter device, in which the FET device illustrated controls current to a buried-emitter bipolar device which provides high-voltage withstand capability.

For another example, although the disclosed structure and process are directed to fabrication of discrete transistors, it is possible to modify this process to produce integrated devices. However, an integrated process would not be as simple and economical as the disclosed process.

What is claimed is:

1. An MOS-gated trench transistor structure made by the process of:

taking a P-on-N-on-N+ epitaxial or implanted structure;

forming a patterned thick oxide on said structure;

patterning a nitride layer on said structure with an oxide pad under it to define deep body locations;

performing a first silicon etch to provide undercut under said nitride thereby forming silicon mesas under oxide/nitride islands;

using said nitride as an implant mask for a P+ implant to produce deeper p-type regions;

performing an oxidation step;

removing said nitride to permit performance of two subsequent steps in a self-aligned fashion;

first, performing a trench etch to cut through the tops of said mesas masked by the pattern of said oxide; and second, after growing a substantially uniform layer of oxide in said trench and depositing and patterning polysilicon therein, performing a source implant in a self-aligned step; and depositing and patterning metal.

2. An MOS-gated trench transistor structure made by the process of:

taking an N-on-P-on-P+ epitaxial or implanted structure;

forming a patterned thick oxide on said structure;

patterning a nitride layer on said structure with an oxide pad under it to define deep body locations;

performing a first silicon etch to provide undercut under said nitride thereby forming silicon mesas under oxide/nitride islands;

using said nitride as an implant mask for an N+ implant to produce deeper n-type regions;

performing an oxidation step;

removing said nitride to permit performance of two subsequent steps in a self-aligned fashion;

first, performing a trench etch to cut through the tops of said mesas masked by the pattern of said oxide; and second, after growing a substantially uniform layer of oxide in said trench and depositing and patterning polysilicon therein, performing a source implant in a self-aligned step; and depositing and patterning metal.

* * * * *